United States Patent

[11] 3,579,055

[72] Inventor Bernd Ross
Arcadia, Calif.
[21] Appl. No. 750,280
[22] Filed Aug. 5, 1968
[45] Patented May 18, 1971
[73] Assignee Bell & Howell Company

[54] SEMICONDUCTOR LASER DEVICE AND METHOD FOR IT'S FABRICATION
10 Claims, 8 Drawing Figs.

[52] U.S. Cl. .......... 317/234,
317/234, 331/94.5
[51] Int. Cl. .......... H01l 15/00
[50] Field of Search .......... 317/235/27, 235/47, 235/48, 235, 235/43, 235/48.1; 148/175 (Inquired); 331/94.5 (Inquired)

[56] References Cited
UNITED STATES PATENTS

| | | | |
|---|---|---|---|
| 3,341,937 | 9/1967 | Dill, Jr. .......... | 29/583 |
| 3,303,432 | 2/1967 | Garfinkel et al. .......... | 331/94.5 |
| 3,458,369 | 7/1969 | Marinace .......... | 148/175 |
| 3,465,159 | 9/1969 | Stern .......... | 250/213 |

OTHER REFERENCES
ELECTRONIC ENGINEER, June 1967, page 26
Le May, I.B.M. TECHNICAL DISCLOSURE BULLETIN, Vol. 5, No. 2, July 1962, page 17
Pilkuhn et al. I.B.M. TECH. DISCL. BULL., Vol. 8, No. 11, April 1966 page 1561

*Primary Examiner*—John W. Huckert
*Assistant Examiner*—Martin H. Edlow
*Attorney*—Nilsson, Robbins, Wills & Berliner

ABSTRACT: An integral semiconductor diode laser designed for increased heat-dissipation efficiency. A diode element is sandwiched between, and is integral with, layers of semiinsulating semiconductor material. Opposed cleaved surfaces are provided on the device cutting across the diode PN junction and defining a laser cavity through which the PN junction extends. In preparation, a layer of high conductivity semiconductor material is disposed integral with a layer of semiinsulating semiconductor material and the semiinsulating material is grooved to expose portions of the surface of the high conductivity material. Semiconductor material of one conductivity type is then deposited on the exposed high conductivity material, followed by the provision of semiconductor material of opposite conductivity type to form PN junctions within the grooves. The top surface is then lapped to provide coplanarity between the semiinsulating and diode element materials. Electrical contacts are then disposed on the top, coplanar surface and bottom, high conductivity surface.

INVENTOR

BERND ROSS

BY Nilsson & Robbins
ATTORNEYS

SEMICONDUCTOR LASER DEVICE AND METHOD FOR IT'S FABRICATION

BACKGROUND OF THE INVENTION

1. Field of the Invention

The field of art to which the invention pertains includes the field of barrier layer devices.

2. Description of the Prior Art

Injection electroluminescence results when a semiconductor PN junction is biased in the forward direction so that electrons are injected into the P side and holes into the N side. These minority carriers radiatively recombine within a diffusion length to emit light at the PN junction. A lasing structure can be provide by cleaving the ends of the semiconductor crystal so that the cleaved ends are parallel to each other and perpendicular to the PN junction. In such structures, it is theorized that an electromagnetic wave propagates along the plane of the junction from one cleaved or polished face of the crystal to the other and along its path is amplified by the radiative recombination of injected minority carriers. In turn, these carriers are stimulated by the wave. When the wave reaches the opposite cleaved face it is partly reflected back and then partly reflected again. If the amplitude of the wave at that point equals that of the starting wave, the threshold for lasing has been reached and laser radiation occurs.

Injection diode lasing was fist obtained with a gallium arsenide diode emitting light at about 8,450 A. More recently, laser action has been reported with indium arsenide, indium phosphide, indium antimonide, lead selenide, gallium antimonide, lead sulfide and alloys having similar band structures such $GaAs_xP_{11x}$, and $InAs_xP_{11x}$, emitting light at wavelengths of from about 6,300 to about 85,000 A.

Original experiments with gallium arsenide PN junction lasers were conducted at very low temperatures, about 20° K. At such temperatures, the threshold values are low, e.g., $10^3$ amp/cm.$^2$, but the threshold value rises rapidly until at room temperature it is typically $10^5$amp/cm.$^2$. For a laser having a cross-sectional area of about $10^{13}$cm.$^2$, currents at room temperature are thus about 100 amperes. The part of current applied to the device which is below threshold produces only spontaneous light emission. Such emission contributes very little to light output, but the currents generating it heat up the device. The resultant rise in temperature raises the threshold current which decreases the fraction of current that contributes to lasing which, in turn, results in a further temperature rise and resultant rise in threshold current. However, heat flows from the diode to its surroundings and a steady-state temperature is eventually reached. If, at that point, there is sufficient current passing through the diode to exceed the threshold current, lasing will occur. Whether or not such a condition can be reached depends on the threshold current, its temperature dependence, and the efficiency of extracting heat from the diode. The present invention is concerned with the latter aspect.

SUMMARY OF THE INVENTION

The present invention provides a semiconductor diode laser structure of increased heat capacitance. A diode laser element having a PN junction defined by opposite conductivity type layers is sandwiched between layers of semiinsulating semiconductor material integral therewith and laterally disposed with respect to the PN junction. Opposed cleaved faces are provided on the diode element, cutting across the PN junction and defining a laser cavity through which the PN junction extends. The top surfaces of the diode element and adjacent semiinsulating material are coplanar and an electrical contact is disposed thereon. A layer of high conductivity semiconductor material is integral with the bottom surfaces of the diode element and adjacent semiinsulating material. An electrical contact is disposed on such bottom layer to complete the structure.

In fabricating the device, a body of high conductivity semiconductor material is provided that has at least two strips of semiinsulating semiconductor material on a surface thereof, which strips extend a predetermined distance from such surface and are spaced from each other to demarcate a portion of such surface therebetween. Such a structure is obtained by disposing the body of high conductivity material as an integral layer on a coextensive member of semiinsulating semiconductor material, followed by denticulation or grooving of the semiinsulating material to form the foregoing strips. Semiconductor material of a first conductivity type is then deposited on the demarcated surface to a thickness less than the thickness of the strips of semiinsulating material, i.e., less than the aforesaid predetermined distance. Semiconductor material of opposite conductivity to the first conductivity type is then provided, e.g., by diffusion or by deposition, on the semiconductor material of first conductivity type to form a PN junction therebetween. The top surfaces of the second semiconductor material and adjacent semiinsulating material are lapped to be coplanar. A metallic contact is then applied integral with such surface and another contact is applied on the bottom of the device, on the high conductivity semiconductor material.

A plurality of laser diodes can be simultaneously fabricated by providing a plurality of strips of semiinsulating material, each strip being at least a plurality of times longer than the length of the laser cavity. A plurality of the foregoing PN junctions are then formed between opposed semiinsulating strips and, after lapping, as above, and applying metal contacts, separate bars are cleaved, each containing a single channel of diode element. Each bar is then cleaved into a number of lasers of suitable dimensions.

In using the term "semiconductor" to described materials suitable for this invention, reference is made not to the actual electrical properties per se of the material, but rather to the nature of the material in its native state, i.e., before doping thereof. Thus, the term "high conductivity semiconductor material" is meant to refer to those materials that are normally semiconducting but which have been degeneratively doped so as to be good conductors of electricity. Similarly, in referring to "semiinsulating semiconductor" material, the term is meant to include either pure semiconductor material or semiconductor material that has been doped with impurities that result in deep-lying traps, as known in the art, e.g., gallium arsenide containing about $10^{17}$ atoms/cm.$^3$ of chromium.

Semiconductor materials suitable for making diode lasers are well known in the art as are techniques and methods for doping them to provide different conductivity types. Generally, the term semiconductor material is considered generic to selenium, tellurium, germanium, silicon, and germanium-silicon alloy, and compounds such as silicon carbide, indium antimonide, gallium antimonide, aluminum antimonide, indium arsenide, zinc sulfide, gallium arsenide, gallium phosphorus alloys, indium phosphorus alloys, lead selenide, lead telluride, and the like including other compounds mentioned above. A region of semiconductor material containing an excess of donor impurities and having an excess of free electrons is considered to be an N-type region, while a P-type region is one containing an excess of acceptor impurities resulting in a deficit of electrons, or stated differently, in an excess of holes. When a continuous solid specimen of crystal semiconductor material has an N-type region adjacent to a P-type region the boundary between them is termed a PN (or NP) junction and the specimen of semiconductor material is termed a PN junction semiconductor device. Active impurities are those impurities which effect the electrical rectification characteristics of semiconductor materials as distinguished from other impurities which have no appreciable effect on these characteristics. Impurities, e.g., for gallium arsenide and the like, include sulfur, tellurium and selenium as donor impurities, and zinc, cadmium and manganese as acceptor impurities. For silicon or other group IV semiconductors, phosphorous, arsenic and antimony are donor impurities, whereas boron, aluminum and gallium are acceptor impurities.

A region heavily doped with donor impurities so as to have a greater concentration of active impurity than the minimum required to determine conductivity type, is designated as an $n+$ region. Similarly a $p+$ region indicates a more heavily than normal doped region of P-type conductivity.

DESCRIPTION OF THE PREFERRED EMBODIMENTS

Figure 1:
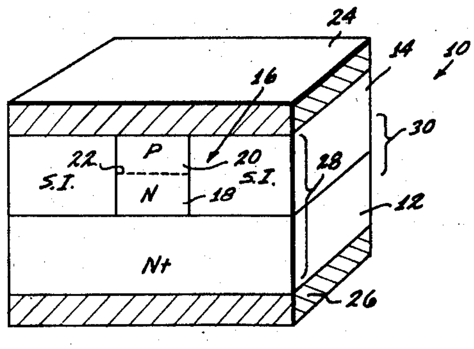
FIG. 1 is a schematic, perspective view of a semiconductor diode laser of this invention.

Referring to FIG. 1, a semiconductor injection laser 10 of this invention is depicted having a high conductivity $n+$ layer 12 on which are disposed strips of semiinsulating semiconductor material 14 sandwiching a diode element 16 therebetween. The diode element consists of a region 18 of N-type conductivity material abutting the high conductivity $n+$ layer 12, and a region 20 of P-type conductivity material on the N-type region 18 and defining a PN junction 22 therebetween. The top surfaces of the strips 14 of semiinsulating material and P-type conductivity material 20 of the diode element 16 are coplanar and a metal contact plate 24 is alloyed thereto. Another metal plate 26 is alloyed to the bottom of the high conductivity layer 12. Opposed cleaved planar surfaces 28 and 30 are provided on the device cutting across the PN junction 22 and defining a Fabry-Perot cavity through which the PN junction extends.

The foregoing structure possesses increased heat capacitance compared to semiconductor structures of the prior art. Prior art structures have sandwiched the diode laser element between semiinsulating semiconductor material spaced from the element and not integral therewith, and do not provide a degeneratively doped, high conductivity layer integral with the diode element and semiinsulating material. The present structure is to enable more efficient heat dissipation so as to obtain lasing at temperatures higher than heretofore obtainable, and to obtain smaller PN junction areas than heretofore practical.

Referring to FIGS. 2a—2g, a method for fabricating the device is depicted. The description will be given for GaAsP, but any of the other lasing materials noted above, including other mixed crystals, can be substituted.

Figure 2A:
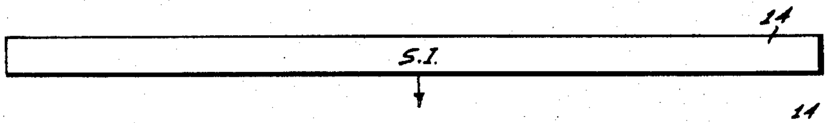
FIGS. 2a—2f are schematic sectional views depicting various stages in the fabrication of the laser device of FIG. 1.
Figure 2B:
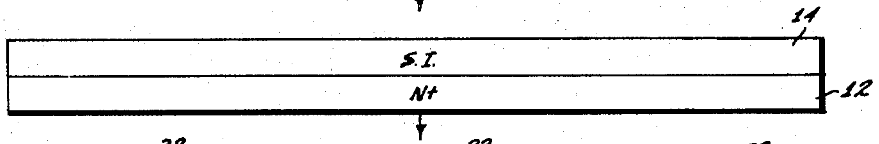

Referring to FIG. 2a, a wafer 14 of semiinsulating gallium arsenide, e.g., doped with chromium, as described above, is selected and is advantageously of (100) orientation. A layer 12 of high conductivity is epitaxially deposited on the wafer 14. Such a layer can be gallium arsenide degeneratively doped with about $10^{18}$ atoms/centimeter of tellurium.

Figure 2C:
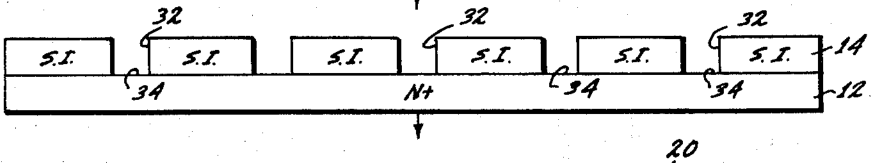

Referring to FIG. 2c, the semiinsulating material is denticulated, either by a mechanical process or by well-known photoresist etching procedures. To provide a plurality of grooves or channels 32 extending to the surface 34 of the high conductivity layer 12 and demarcating portions of such surface 34 for subsequent deposition of the diode element 16.

Figure 2D:
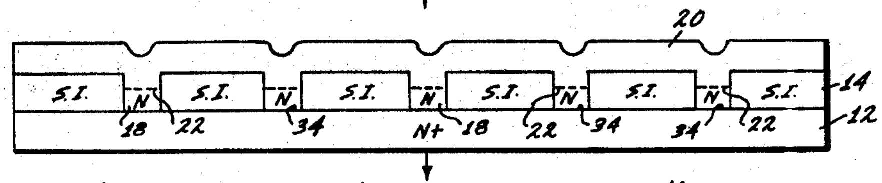

Referring to FIG. 2d, GaAsP, e.g., $GaAs_{0.70}P_{0.35}$ doped with $10^{17-18}$ atoms/cm.$^3$ of tellurium to provide N-type conductivity, is deposited on the structure of FIG. 2c so as to deposit on the demarcated surface 34 of the high conductivity layer 12 between the strips of semiinsulating material 14. Deposition can be accomplished by vapor transport or solution growth techniques as known in the art. Doping impurity is reversed during deposition after a substantial amount of N-type conductivity material 18 has been deposited, but well prior to obtaining such a deposit as thick as the thickness of the strips of semiinsulating material 14. Reversal of doping is accomplished by terminating flow of the donor-containing gaseous chemical and simultaneously initiating flow of the acceptor (e.g., zinc, cadmium)-containing gaseous chemical so as to deposit P-type conductivity material 20 on the N-type conductivity material 18. Such deposition is continued until the epitaxially deposited layer 20 overlaps the top surfaces of the semiinsulating bars 14. Thus, PN junctions 22 are formed with each channel 32 containing a single PN junction 22 extending longitudinally therein. Alternatively, one can diffuse acceptor impurity atoms into the N-type conductivity layer to obtain a PN junction, as known in the art.

Figure 2E:
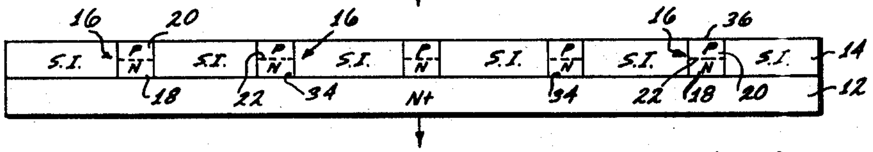

Referring to FIG. 2e, the epitaxial layer of P-type conductivity material 20 is lapped until the semiinsulating material 14 is again exposed. The surfaces of the semiinsulating material 14 and upper diode element 16 surface are thus lapped coplanar. Alternatively, one can deposite the P-type conductivity material 20 in sufficient thickness to obtain a diode structure but without exceeding the height of the semiinsulating strips 14. Lapping is accomplished as before to obtain a coplanar surface 36.

Figure 2F:
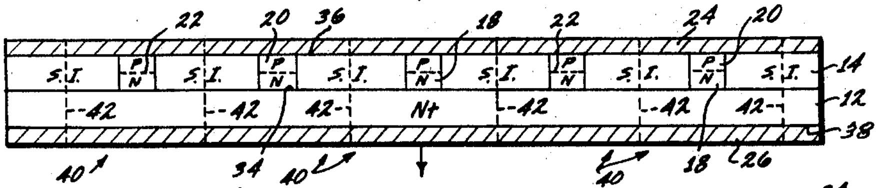
Figure 2G:
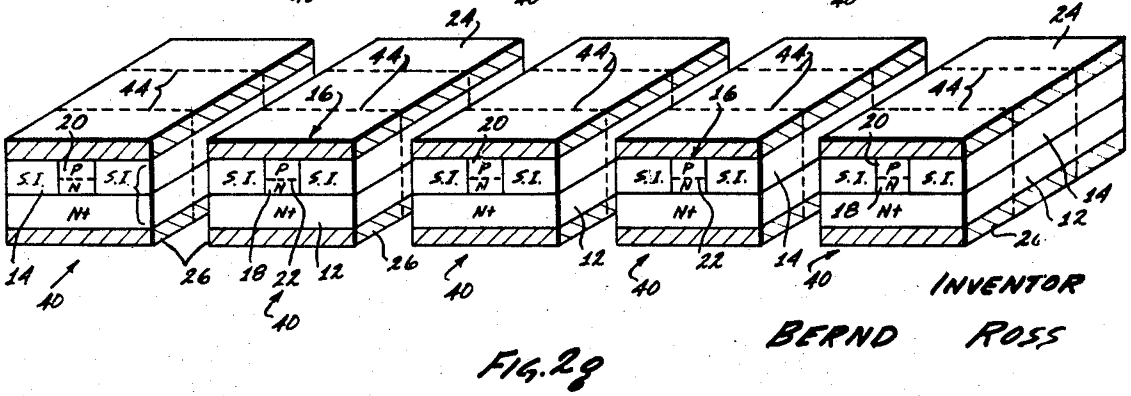
FIG. 2g is a schematic, perspective view of a plurality of semiconductor diode laser devices of FIG. 1 in a still later stage of fabrication thereof.

Referring to FIG. 2f, metal contacts 24 and 26 are applied to the top coplanar surface 36 and to the bottom surface 38 of the high conductivity layer 12, respectively. The metal contact plates 24 and 26 can be appropriately doped gold metal and alloyed with heat to the respective surface, as is known in the art. Next, a plurality of bars 40 are cleaved from the structure along cleave lines 42 (shown in shadow) to yield a plurality of the elongated structures 40 as shown in FIG. 2g. Referring to FIG. 2g, each bar 40 is cleaved along cleave lines 44 to subdivide the bars 40 into a plurality of lasers having opposed parallel cleaved faces 28 and 30, perpendicular to the PN junction (FIG. 1) and having dimensions of approximately 10 mils long by 10 mils wide by 5 mils thick. Electrical leads can be applied, e.g., with solder, directly to the metal contact plates 24 and 26 and then connected to appropriate circuitry, as known in the art, to provide semiconductor injection lasers of increased heat capacitance.

I claim:

1. A method for fabricating an integral semiconductor diode laser device, comprising:
   - forming on a surface of a body of high conductivity semiconductor material of a first conductivity type at least two strips of semiinsulating semiconductor material extending a predetermined distance from said predetermined and spaced from each other to demarcate a portion of said surface therebetween;
   - depositing semiconductor material of said first conductivity type of said demarcated surface;
   - forming semiconductor material of second conductivity type, opposite in conductivity to said first conductivity type, on said semiconductor material of first conductivity type to form a PN junction therebetween below said predetermined distance; and
   - cleaving opposed surfaces of said device whereby to cut across said PN junction and define a laser cavity through which said PN junction extends.

2. The method of claim 1 wherein said semiconductor material of first conductivity type is deposited to a thickness less than said predetermined distance and said semiconductor material of second conductivity type is epitaxially deposited on said semiconductor material of second conductivity type.

3. The method of claim 1 including the step of lapping the top surfaces of said semiinsulating material and said semiconductor material of second type conductivity to form a coplanar surface thereof.

4. The method of claim 1 wherein said semiconductor material of second conductivity is deposited so as to extend beyond the top surface of said semiinsulating material and said semiconductor material of second type conductivity and said semiinsulating material are lapped to form a coplanar surface thereof.

5. The method of claim 1 including the step of forming electrical contact means on said body of high conductivity semiconductor material and on said semiconductor material of second type conductivity.

6. The method of claim 3 including the step of forming an electrical contact on said body of high conductivity semiconductor material and an electrical contact on said single surface abutting both said semiconductor material of second type conductivity and said semiinsulating material.

7. The method of claim 1 wherein said strips are formed by disposing said body as an integral layer on a member of semiinsulating semiconductor material and then grooving said member to form said strips of semiinsulating semiconductor material.

8. The method of claim 1 wherein said strips are at least a plurality of times longer than the length of said laser cavity and said structure is laterally cleaved along its length to provide a plurality of said diode lasers.

9. The method of claim 1 wherein a plurality greater than two of strips of said semiinsulating material are formed on said body surface thereby demarcating a plurality of portions of said surface so that a plurality of said PN junctions are formed, and said structure is subdivided to obtain a plurality of diode structures, each structure having a single PN junction.

10. The method of claim 9 wherein each subdivided diode structure is at least a plurality of times longer than the length of said laser cavity and each of said structures is laterally cleaved along its length to provide a plurality of said diode lasers.